United States Patent
Goto et al.

(10) Patent No.: US 11,662,374 B2
(45) Date of Patent: May 30, 2023

(54) GROUP III NITRIDE SEMICONDUCTOR SUBSTRATE

(71) Applicant: FURUKAWA CO., LTD., Tokyo (JP)

(72) Inventors: Hiroki Goto, Tochigi (JP); Yujiro Ishihara, Tochigi (JP)

(73) Assignee: FURUKAWA CO., LTD., Tokyo (JP)

( * ) Notice: Subject to any disclaimer, the term of this patent is extended or adjusted under 35 U.S.C. 154(b) by 762 days.

(21) Appl. No.: 16/493,659

(22) PCT Filed: Mar. 9, 2018

(86) PCT No.: PCT/JP2018/009296
§ 371 (c)(1),
(2) Date: Sep. 12, 2019

(87) PCT Pub. No.: WO2018/168706
PCT Pub. Date: Sep. 20, 2018

(65) Prior Publication Data
US 2020/0132750 A1    Apr. 30, 2020

(30) Foreign Application Priority Data
Mar. 17, 2017   (JP) .............................. JP2017-052384

(51) Int. Cl.
*C30B 29/40*   (2006.01)
*G01R 31/265*   (2006.01)

(52) U.S. Cl.
CPC ........ *G01R 31/2656* (2013.01); *C30B 29/403* (2013.01)

(58) Field of Classification Search
CPC ....... C30B 29/403; C30B 29/38; C30B 29/40; C30B 25/16; C30B 29/406; C30B 25/02;
(Continued)

(56) References Cited

U.S. PATENT DOCUMENTS 7,435,608 B2   10/2008   Shibata
8,258,051 B2   9/2012   Mizuhara
(Continued)

FOREIGN PATENT DOCUMENTS

CN   105917035 A   8/2016
JP   2005343713 A   12/2005
(Continued)

OTHER PUBLICATIONS

Freitas et al., Growth of High Crystalline Quality HVPE-GaN Crystals with Controlled Electrical Properties, 2015, Crystal Growth & Design, vol. 15, pp. 4837-4842 (Year: 2015).*
(Continued)

*Primary Examiner* — Coris Fung
*Assistant Examiner* — Ritu S Shirali
(74) *Attorney, Agent, or Firm* — Rankin, Hill & Clark LLP

(57) ABSTRACT

According to the present invention, there is provided a group III nitride semiconductor substrate (free-standing substrate 30) that is formed of group III nitride semiconductor crystals. Both exposed first and second main surfaces in a relationship of top and bottom are semipolar planes. A variation coefficient of an emission wavelength of each of the first and second main surfaces, which is calculated by dividing a standard deviation of an emission wavelength by an average value of the emission wavelength, is 0.05% or less in photoluminescence (PL) measurement in which mapping is performed in units of an area of 1 mm$^2$ by emitting helium-cadmium (He—Cd) laser, which has a wavelength of 325 nm and an output of 10 mW or more and 40 mW or less, at room temperature. In a case where devices are manufactured over the free-standing substrate 30, variations in quality among the devices are suppressed.

6 Claims, 9 Drawing Sheets

(58) Field of Classification Search
CPC ............... G01R 31/2656; C23C 16/34; H01L 33/0075
USPC .................................................... 324/762.01
See application file for complete search history.

(56) References Cited

U.S. PATENT DOCUMENTS

| | | |
|---|---|---|
| 8,404,042 B2 | 3/2013 | Mizuhara |
| 8,709,843 B2 | 4/2014 | Shakuda |
| 8,709,923 B2 | 4/2014 | Mizuhara |
| 8,872,309 B2 | 10/2014 | Mizuhara |
| 9,064,706 B2 | 6/2015 | Mizuhara |
| 9,627,581 B2 | 4/2017 | Choe |
| 9,673,046 B2 | 6/2017 | Tsukada et al. |
| 10,041,186 B2 | 8/2018 | Imai et al. |
| 10,066,319 B2 | 9/2018 | Tsukada et al. |
| 10,475,887 B2 | 11/2019 | Nagao et al. |
| 10,655,244 B2 | 5/2020 | Tsukada et al. |
| 10,734,485 B2 | 8/2020 | Tsukada et al. |
| 2005/0274976 A1 | 12/2005 | Shibata |
| 2007/0040219 A1 | 2/2007 | Shibata |
| 2009/0081857 A1* | 3/2009 | Hanser ............... C30B 29/406 257/E21.108 |
| 2009/0236694 A1 | 9/2009 | Mizuhara |
| 2009/0269867 A1 | 10/2009 | Shakuda |
| 2012/0315445 A1 | 12/2012 | Mizuhara |
| 2013/0160699 A1 | 6/2013 | Mizuhara |
| 2014/0175616 A1 | 6/2014 | Mizuhara |
| 2015/0008563 A1 | 1/2015 | Mizuhara |
| 2015/0311068 A1 | 10/2015 | Tsukada et al. |
| 2015/0357521 A1 | 12/2015 | Choe |
| 2016/0233306 A1 | 8/2016 | Nagao et al. |
| 2016/0319460 A1 | 11/2016 | Tsukada et al. |
| 2016/0355945 A1 | 12/2016 | Imai et al. |
| 2017/0200789 A1 | 7/2017 | Tsukada et al. |
| 2018/0334758 A1 | 11/2018 | Tsukada et al. |
| 2019/0312111 A1 | 10/2019 | Nagao et al. |
| 2020/0013860 A1 | 1/2020 | Nagao et al. |
| 2020/0321438 A1 | 10/2020 | Tsukada et al. |

FOREIGN PATENT DOCUMENTS

| | | |
|---|---|---|
| JP | 2008-91598 A | 4/2008 |
| JP | 2008078613 A | 4/2008 |
| JP | 2009238772 A | 10/2009 |
| JP | 2011042542 A | 3/2011 |
| JP | 5332168 B2 | 11/2013 |
| JP | 2014172797 A | 9/2014 |
| JP | 2016012717 A | 1/2016 |
| JP | 6232150 B1 | 11/2017 |
| JP | 6266742 B1 | 1/2018 |

OTHER PUBLICATIONS

Frentrup et al., Crystal orientation of GaN layers on ($10\overline{1}0$) m-plane sapphire, 2011, Physica Status Solidi B, vol. 248, No. 3, 583-587 (Year: 2011).*

International Search Report dated Jun. 5, 2018 filed in PCT/JP2018/009296.

D. Gogova, et al., "Large-area free-standing GaN substrate grown by hydride vapor phase epitaxy on epitaxial lateral overgrown GaN template", Physica B, 2006, pp. 133-139, vol. 371, Elsevier B.V., Amsterdam, Netherlands; Cited in ISR.

P. Vennegues, et al., "Study of the epitaxial relationships between III-nitrides and M-plane sapphire", Journal of Applied Physics, 2010, pp. 113521-1-113521-6, vol. 108, No. 11, American Institute of Physics, USA; Cited in ISR.

Extended European Search Report (EESR) dated Nov. 30, 2020 issued in the corresponding European Patent Application No. 18768215.8.

Yablonskii et al., "Carrier diffusion length measured by optical method in GaN epilayers grown by MOCVD on sapphire substrates", Journal of Crystal Growth, Elsevier, 2005, vol. 275, pp. e1733-e1738; Cited in EESR.

Chinese Office Action (CNOA) dated Dec. 23, 2020 in the corresponding Chinese Patent Application No. 201880019839.6.

* cited by examiner

EMISSION WAVELENGTH MAPPING

EMISSION INTENSITY MAPPING

PL HALF WIDTH MAPPING

EMISSION WAVELENGTH MAPPING

EMISSION INTENSITY MAPPING

PL HALF WIDTH MAPPING

EMISSION WAVELENGTH MAPPING

EMISSION INTENSITY MAPPING

PL HALF WIDTH MAPPING

EMISSION WAVELENGTH MAPPING

EMISSION INTENSITY MAPPING

PL HALF WIDTH MAPPING

GROUP III NITRIDE SEMICONDUCTOR SUBSTRATE

TECHNICAL FIELD

The present invention relates to a group III nitride semiconductor substrate.

BACKGROUND ART

A substrate including a group III nitride semiconductor layer having a semipolar plane as a main surface has been developed. A related technique is disclosed in Patent Document 1.

Patent Document 1 discloses a substrate having a layer which is formed of a group III nitride semiconductor and in which the normal of the main surface is inclined in the range of 5° or more and 17° or less in the +c axis direction from the [11-22] axis.

As a manufacturing method therefor, a method of forming a layer, such as that described above, by epitaxially growing a group III nitride semiconductor over a base substrate (a sapphire substrate, a group III nitride semiconductor substrate, or the like) whose main surface has a predetermined plane orientation, with a semipolar plane having a Ga polar component as a growth plane, using a metal organic chemical vapor deposition (MOCVD) method, a molecular beam epitaxy method, a hydride vapor phase epitaxy (HVPE) method, or the like is disclosed.

Patent Document 2 discloses manufacturing a substrate including a group III nitride semiconductor layer, which has a semipolar plane as a main surface, by bonding crystals grown from plural small pieces each having a semipolar plane as a main surface.

RELATED DOCUMENT

Patent Document

[Patent Document 1] Japanese Unexamined Patent Application Publication No. 2016-12717
[Patent Document 2] Japanese Patent No. 5332168

SUMMARY OF THE INVENTION

Technical Problem

As in the technique disclosed in Patent Document 1, in the growth with the semipolar plane having a Ga polar component as a growth plane, the amount of unintended acquisition of oxygen atoms increases. For this reason, the crystallinity becomes worse as the growth thickness increases. In addition, in the case of the technique disclosed in Patent Document 2, recesses, defects, and the like are generated at joints on the boundary of the plural small pieces. As a result, the optical characteristics of the crystal are changed (optical characteristics within the substrate plane become nonuniform). In a case where plural devices (such as optical devices) are manufactured over such a substrate, variations in quality among the plural devices may occur. An object of the present invention is to solve the problem.

Solution to Problem

According to the present invention, there is provided a group III nitride semiconductor substrate that is formed of group III nitride semiconductor crystals. Both exposed first and second main surfaces in a relationship of top and bottom are semipolar planes. A variation coefficient of an emission wavelength of each of the first and second main surfaces is 0.05% or less in photoluminescence (PL) measurement performed under conditions in which mapping is performed in units of an area of 1 $mm^2$ by emitting helium-cadmium (He—Cd) laser, which has a wavelength of 325 nm and an output of 10 mW or more and 40 mW or less, at room temperature.

Advantageous Effects of Invention

According to the present invention, variations in quality among plural devices manufactured over a group III nitride semiconductor substrate can be suppressed.

BRIEF DESCRIPTION OF THE DRAWINGS

The objects described above, other objects, characteristics, and advantages will be made clearer from preferred embodiments described below and the following accompanying drawings.

DESCRIPTION OF EMBODIMENTS

Hereinafter, a method of manufacturing a group III nitride semiconductor substrate of the present embodiment will be described with reference to the drawings. The diagrams are merely schematic diagrams for illustrating the configuration of the invention, and the sizes, shapes, and numbers of respective members, the ratios of the sizes of different members, and the like are not limited to those illustrated.

First, the outline of the method of manufacturing a group III nitride semiconductor substrate will be described. According to the method of manufacturing a group III nitride semiconductor substrate of the present embodiment including plural characteristic steps, it is possible to grow a group III nitride semiconductor over a sapphire substrate with a semipolar plane (semipolar plane which is represented by Miller index (hkml) and in which 1 is less than 0) on the N polarity side as a growth plane using the MOCVD method. As a result, a template substrate in which a group III nitride semiconductor layer whose exposed surface is a semipolar plane on the N polarity side is located over a sapphire substrate or a free-standing substrate of group III nitride semiconductor obtained by removing a sapphire substrate from the template substrate is obtained.

Then, according to the method of manufacturing a group III nitride semiconductor substrate of the present embodiment, thick film growth of the group III nitride semiconductor can be performed over the template substrate or the free-standing substrate with the semipolar plane on the N polarity side as a growth plane using the HVPE method. As a result, a bulk crystal of a group III nitride semiconductor whose exposed surface is a semipolar plane on the N polarity side is obtained. Then, by slicing or the like of the bulk crystal, a large number of free-standing substrates of group III nitride semiconductor can be obtained.

Figure 1:
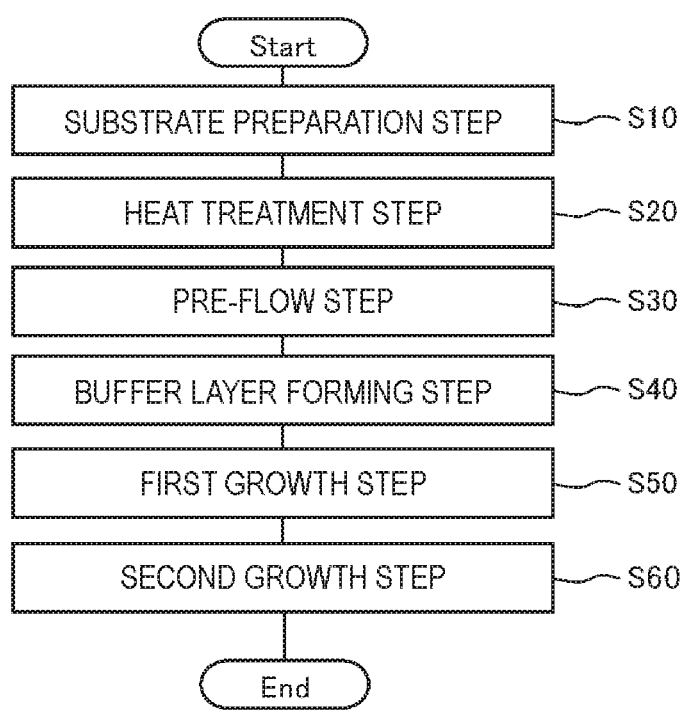
FIG. 1 is a flowchart showing an example of the flow of the process of a method of manufacturing a group III nitride semiconductor substrate of the present embodiment.

Next, the method of manufacturing a group III nitride semiconductor substrate will be described in detail. FIG. 1 shows an example of the flow of the process of the method of manufacturing a group III nitride semiconductor substrate of the present embodiment. As shown in the diagram, a substrate preparation step S10, a heat treatment step S20, a pre-flow step S30, a buffer layer forming step S40, a first growth step S50, and a second growth step S60 are included. Although not shown, a cutting step may be included after the second growth step S60.

In the substrate preparation step S10, a sapphire substrate is prepared. The diameter of the sapphire substrate is, for example, 1 inch or more. In addition, the thickness of the sapphire substrate is, for example, 250 μm or more.

The plane orientation of the main surface of the sapphire substrate is one of plural factors for controlling the plane orientation of the growth plane of the group III nitride semiconductor layer epitaxially grown thereover. The relationship between the factor and the plane orientation of the growth plane of the group III nitride semiconductor layer is shown in the following example. In the substrate preparation step S10, a sapphire substrate whose main surface has a desired plane orientation is prepared.

The main surface of the sapphire substrate is, for example, a {10-10} plane or a plane obtained by making the {10-10} plane inclined by a predetermined angle in a predetermined direction.

The plane obtained by making the {10-10} plane inclined by a predetermined angle in a predetermined direction may be, for example, a plane obtained by making the {10-10} plane inclined by any angle greater than 0° and equal to or less than 0.5° in any direction.

In addition, the plane obtained by making the {10-10} plane inclined by a predetermined angle in a predetermined direction may be, for example, a plane obtained by making the {10-10} plane inclined by any angle greater than 0° and less than 10.5° in a direction in which the {10-10} plane becomes parallel to the a-plane. Alternatively, the plane obtained by making the {10-10} plane inclined by a predetermined angle in a predetermined direction may be, for example, a plane obtained by making the {10-10} plane inclined by any angle greater than 0° and equal to or less than 10.5° in a direction in which the {10-10} plane becomes parallel to the a-plane. For example, the plane obtained by making the {10-10} plane inclined by a predetermined angle in a predetermined direction may be a plane obtained by making the {10-10} plane inclined by any angle of 0.5° or more and 1.5° or less, 1.5° or more and 2.5° or less, 4.5° or more and 5.5° or less, 6.5° or more and 7.5° or less, and 9.5° or more and 10.5° or less in a direction in which the {10-10} plane becomes parallel to the a-plane.

The heat treatment step S20 is performed after the substrate preparation step S10. In the heat treatment step S20, heat treatment is performed on the sapphire substrate under the following conditions.

Temperature: 800° C. or higher and 1200° C. or lower
Pressure: 30 torr or higher to 760 torr or lower
Heat treatment time: 5 minutes or more and 20 minutes or less
Carrier gas: $H_2$, or $H_2$ and $N_2$ ($H_2$ ratio of 0 to 100%)
Carrier gas supply rate: 3 slm or more and 50 slm or less (however, since the supply rate changes according to the size of the growth apparatus, the supply rate is not limited thereto.)

The heat treatment on the sapphire substrate may be performed while performing nitriding treatment, or may be performed without performing nitriding treatment. In a case where the heat treatment is performed while performing the nitriding treatment, $NH_3$ of 0.5 slm or more and 20 slm or less is supplied onto the sapphire substrate during the heat treatment (however, since the supply rate changes depending on the size of the growth apparatus, the supply rate is not limited thereto). In addition, in a case where the heat treatment is performed without performing the nitriding treatment, $NH_3$ is not supplied during the heat treatment.

The presence or absence of the nitriding treatment during the heat treatment may be one of plural factors for controlling the plane orientation of the growth plane of the group III nitride semiconductor layer epitaxially grown over the main surface of the sapphire substrate. The relationship between the factor and the plane orientation of the growth plane of the group III nitride semiconductor layer is shown in the following example.

The pre-flow step S30 is performed after the heat treatment step S20. In the pre-flow step S30, a metal-containing gas is supplied onto the main surface of the sapphire substrate under the following conditions. The pre-flow step S30 may be performed, for example, in an MOCVD apparatus.

Temperature: 500° C. or higher and 1000° C. or lower
Pressure: 30 torr or higher to 200 torr or lower
Trimethylaluminum supply rate, supply time: 20 ccm or more and 500 ccm or less, 1 second or more and 60 seconds or less
Carrier gas: $H_2$, or $H_2$ and $N_2$ ($H_2$ ratio of 0 to 100%)
Carrier gas supply rate: 3 slm or more and 50 slm or less (however, since the gas supply rate changes depending on the size or the configuration of the growth apparatus, the gas supply rate is not limited thereto.)

The conditions described above are for a case of supplying trimethylaluminum and triethylaluminum, which are organic metal materials, as the metal-containing gas. In this step, a metal-containing gas containing other metals instead of trimethylaluminum, triethylaluminum may be supplied, and other metal films, such as a titanium film, a vanadium film, or a copper film, may be formed over the main surface of the sapphire substrate instead of the aluminum film. In addition, other metal carbide films, such as aluminum carbide, titanium carbide, vanadium carbide, and copper carbide, which are reaction films with hydrocarbon compounds such as methane, ethylene, or ethane generated from organic metal raw materials, may be formed over the main surface of the sapphire substrate.

In the pre-flow step S30, a metal film and a metal carbide film are formed over the main surface of the sapphire substrate. The presence of the metal film is a condition for reversing the polarity of the crystal grown thereover. That is, the execution of the pre-flow step S30 is one of plural factors for setting the plane orientation of the growth plane of the group III nitride semiconductor layer epitaxially grown over the main surface of the sapphire substrate to the plane on the N polarity side.

The buffer layer forming step S40 is performed after the pre-flow step S30. In the buffer layer forming step S40, a buffer layer is formed over the main surface of the sapphire substrate. The thickness of the buffer layer is, for example, 20 nm or more and 300 nm or less.

The buffer layer is, for example, an AlN layer. For example, an AlN crystal may be epitaxially grown under the following conditions to form a buffer layer.

Growth method: MOCVD method
Growth temperature: 800° C. or higher and 950° C. or lower
Pressure: 30 torr or higher to 200 torr or lower
Trimethylaluminum supply rate: 20 ccm or more and 500 ccm or less
$NH_3$ supply rate: 0.5 slm or more and 10 slm or less
Carrier gas: $H_2$, or $H_2$ and $N_2$ ($H_2$ ratio of 0 to 100%)
Carrier gas supply rate: 3 slm or more and 50 slm or less (however, since the gas supply rate changes depending on the size or the configuration of the growth apparatus, the gas supply rate is not limited thereto.)

The growth conditions for the buffer layer forming step S40 may be one of plural factors for controlling the plane orientation of the growth plane of the group III nitride semiconductor layer epitaxially grown over the main surface of the sapphire substrate. The relationship between the factor and the plane orientation of the growth plane of the group III nitride semiconductor layer is shown in the following example.

In addition, the growth conditions (relatively low predetermined growth temperature, specifically, 800 to 950° C., and relatively low pressure) in the buffer layer forming step S40 are conditions for growing AlN while maintaining the N polarity. That is, the growth conditions in the buffer layer forming step S40 are one of plural factors for setting the plane orientation of the growth plane of the group III nitride semiconductor layer epitaxially grown over the main surface of the sapphire substrate to the plane on the N polarity side.

The first growth step S50 is performed after the buffer layer forming step S40. In the first growth step S50, a group III nitride semiconductor crystal (for example, GaN crystal) is epitaxially grown over the buffer layer under the following growth conditions, thereby forming a group III nitride semiconductor layer (first growth layer) whose growth plane has a predetermined plane orientation (semipolar plane on the N polarity side). The thickness of the first growth layer is, for example, 1 μm or more and 20 μm or less.

Growth method: MOCVD method
Growth temperature: 800° C. or higher to 1025° C. or lower
Pressure: 30 torr or higher to 200 torr or lower
TMGa supply rate: 25 sccm or more and 1000 sccm or less
$NH_3$ supply rate: 1 slm or more and 20 slm or less
Carrier gas: $H_2$, or $H_2$ and $N_2$ ($H_2$ ratio of 0 to 100%)
Carrier gas supply rate: 3 slm or more and 50 slm or less (however, since the gas supply rate changes depending on the size or the configuration of the growth apparatus, the gas supply rate is not limited thereto.)
Growth rate: 10 μm/h or higher The growth conditions (relatively low growth temperature, relatively low pressure, and relatively fast growth rate) in the first growth step S50 are conditions for growing GaN while maintaining the N polarity. That is, the growth conditions in the first growth step S50 are one of plural factors for setting the plane orientation of the growth plane of the group III nitride semiconductor layer epitaxially grown over the main surface of the sapphire substrate to the plane on the N polarity side.

Figure 2:
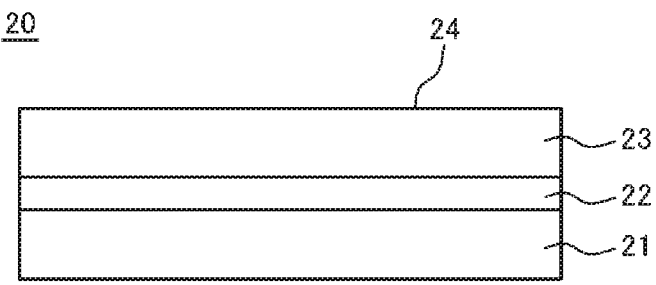
FIG. 2 is a side view schematically showing an example of a template substrate 20 of the present embodiment.

As described above, it is possible to manufacture a template substrate 20 as shown in FIG. 2 in which a sapphire substrate 21, a buffer layer 22, and a group III nitride semiconductor layer (first growth layer 23) are laminated in this order and the plane orientation of a growth plane 24 of the first growth layer 23 is a semipolar plane on the N polarity side. In addition, by adjusting the manufacturing conditions in the range of the above conditions, it is possible to set the plane orientation of the growth plane 24 to a desired semipolar plane.

Figure 3:
FIG. 3 is a side view schematically showing an example of a free-standing substrate 10 of the present embodiment.

In addition, by removing the sapphire substrate 21 and the buffer layer 22 after obtaining the laminate as shown in FIG. 2 in which the sapphire substrate 21, the buffer layer 22, and the group III nitride semiconductor layer (first growth layer 23) are laminated in this order, it is possible to manufacture the free-standing substrate 10 formed of the first growth layer 23 as shown in FIG. 3.

A unit that removes the sapphire substrate 21 and the buffer layer 22 is not particularly limited. For example, the sapphire substrate 21 and the first growth layer 23 may be separated from each other using stress caused by the difference in linear expansion coefficient between the sapphire substrate 21 and the first growth layer 23. Then, the buffer layer 22 may be removed by polishing, etching, or the like.

As another example of removal, a peeling layer may be formed between the sapphire substrate 21 and the buffer layer 22. For example, as a peeling layer, a layer may be formed by forming a laminate of a carbon layer in which carbide (aluminum carbide, titanium carbide, zirconium carbide, hafnium carbide, vanadium carbide, or tantalum carbide) is dispersed and a layer of carbide (aluminum carbide, titanium carbide, zirconium carbide, hafnium carbide, vanadium carbide, or tantalum carbide) over the sapphire substrate 21, and then subjecting the laminate to nitriding treatment.

In a case where the buffer layer 22 and the first growth layer 23 are formed over such a peeling layer and then the laminate is heated at a temperature higher than the heating temperature at the time of forming the first growth layer 23, it is possible to perform separation into a portion on the sapphire substrate 21 side and a portion on the first growth layer 23 side with a portion of the peeling layer as a boundary. By removing the buffer layer 22 and the like from the portion on the first growth layer 23 side by polishing, etching, or the like, it is possible to obtain the free-standing substrate 10 formed of the first growth layer 23 as shown in FIG. 3.

The second growth step S60 is performed after the first growth step S50. In the second growth step S60, a group III nitride semiconductor crystal (for example, GaN crystal) is epitaxially grown over the first growth layer 23 of the template substrate 20 (refer to FIG. 2) or over the main surface (semipolar plane on the N polarity side) of the first growth layer 23 of the free-standing substrate 10 (refer to FIG. 3) under the following growth conditions, thereby forming a group III nitride semiconductor layer (second growth layer) whose growth plane has a predetermined plane orientation (semipolar plane on the N polarity side). The thickness of the second growth layer is, for example, 1.0 mm or more.

Growth method: HVPE method
Growth temperature: 900° C. or higher to 1100° C. or lower
Growth time: 1 hour or longer
V/III ratio: 1 or more and 20 or less
Growth film thickness: 1.0 mm or more The second growth step S60 may not be performed continuously but may be divided into plural steps. For example, after growing up to a predetermined film thickness by the HVPE method, cooling may be once performed and then growing up to a predetermined film thickness by the HVPE method may be performed again. After forming the group III nitride semiconductor layer in the first step, once the group III nitride semiconductor layer is cooled, a crack is generated in the group III nitride semiconductor layer. As a result, internal stress is reduced. Thereafter, in a case where the group III nitride semiconductor is epitaxially grown over the group III nitride semiconductor layer having a crack, as the group III nitride semiconductor grows, crystals separated from each other with the crack interposed therebetween meet each other. Then, since internal stress is reduced by the above-described cooling, cracking does not easily occur in the bulk crystal even if the film is thickened.

The second growth step S60 may be performed in a state in which the template substrate 20 or the free-standing substrate 10 is fixed to a susceptor, such as a carbon susceptor. In this manner, deformation of the template substrate 20 or the free-standing substrate 10 due to the heating in the second growth step S60 can be suppressed. In addition, although a method using an alumina-based adhesive and the like are exemplified as fixing methods, the fixing method is not limited thereto. By these characteristic methods, a large-diameter bulk crystal having a maximum diameter of 50 mm or more and 4 inches or less is realized.

Figure 4:
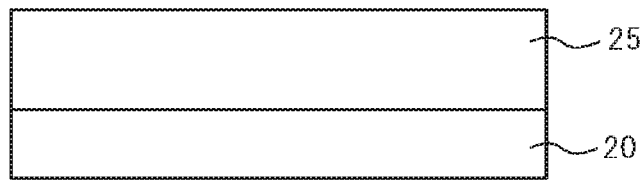
FIG. 4 is a side view schematically showing an example of a structure obtained by the method of manufacturing a group III nitride semiconductor substrate of the present embodiment.
Figure 5:
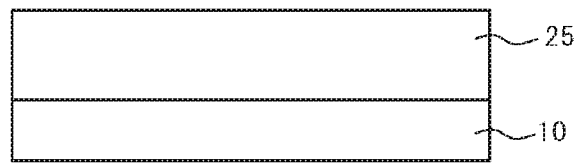
FIG. 5 is a side view schematically showing an example of a structure obtained by the method of manufacturing a group III nitride semiconductor substrate of the present embodiment.

From the above, a laminate (refer to FIG. 4) having the template substrate 20 and a second growth layer 25 or a laminate (refer to FIG. 5) having the free-standing substrate 10 and the second growth layer 25 is obtained.

Figure 6:
FIG. 6 is a side view schematically showing an example of a free-standing substrate 30 of the present embodiment.

In the cutting step performed after the second growth step S60, an free-standing substrate 30 (refer to FIG. 6) formed of a group III nitride semiconductor layer is obtained by cutting the group III nitride semiconductor layer from the bulk crystal including the first growth layer 23 and the second growth layer 25 by slicing or the like. The thickness of the free-standing substrate 30 is, for example, 300 μm or more and 1000 μm or less. The group III nitride semiconductor layer cut by slicing or the like may be formed of only the second growth layer 25, may include the first growth layer 23 and the second growth layer 25, or may be formed of only the first growth layer 23.

However, it is preferable that the group III nitride semiconductor layer cut by slicing or the like is a portion having a growth thickness (thickness counted with the growth start point of the first growth layer 23 as 0) of 3 mm or more within the bulk crystal including the first growth layer 23 and the second growth layer 25. The reason is that the dislocation defect density within the crystal is approximately $1 \times 10^7$ cm$^{-2}$ or less to obtain the quality suitable for a substrate for a device.

Next, the configuration and features of the free-standing substrate (group III nitride semiconductor substrate) 30 obtained by the above manufacturing method will be described.

The free-standing substrate 30 is formed of a group III nitride semiconductor crystal, and both the exposed first and second main surfaces in the relationship of top and bottom are semipolar planes. The first main surface is a semipolar plane on the N polarity side, and the second main surface is a semipolar plane (semipolar plane which is represented by Miller index (hkml) and in which l is greater than 0) on the Ga polarity side. The free-standing substrate 30 is formed of group III nitride semiconductor crystal epitaxially grown with the semipolar plane on the N polarity side as a growth plane.

As shown in the following example, the free-standing substrate 30 manufactured by the above characteristic manufacturing method has a feature that the variation coefficient of the emission wavelength of each of the first and second main surfaces is 0.05% or less in PL measurement in which mapping is performed in units of an area of 1 mm$^2$ by emitting helium-cadmium (He—Cd) laser, which has a wavelength of 325 nm and an output of 10 mW or more and 40 mW or less, at room temperature (10° C. or higher and 30° C. or lower). That is, in both the first and second main surfaces, the in-plane variation in the emission wavelength is very small. In addition, the variation coefficient of the emission wavelength is calculated by dividing the standard deviation of the emission wavelength by the average value of the emission wavelength.

In addition, as shown in the following examples, the free-standing substrate 30 manufactured by the above characteristic manufacturing method has a feature that the variation coefficient of the emission intensity of the second main surface (semipolar plane on the Ga polarity side) is 15% or less, preferably 10% or less in PL measurement performed under the above conditions. That is, in the second main surface, the in-plane variation in the emission intensity in the PL measurement is small. In addition, the variation coefficient of the emission intensity is calculated by dividing the standard deviation of the emission intensity by the average value of the emission intensity.

In addition, as shown in the following examples, the free-standing substrate 30 manufactured by the above characteristic manufacturing method has a feature that the variation coefficient of the half width of the PL spectrum of each of the first and second main surfaces is 3.0% or less in PL measurement performed under the above conditions. That is, in each of the first and second main surfaces, the in-plane variation in the half width of the PL spectrum in the PL measurement is small. In addition, the variation coefficient of the half width of the PL spectrum is calculated by dividing the standard deviation of the half width of the PL spectrum by the average value of the half width of the PL spectrum.

Thus, by the characteristic manufacturing method described above, the free-standing substrate 30 (group III nitride semiconductor substrate) is realized which has a semipolar plane as a main surface and in which in-plane variations in the optical characteristics are suppressed. By manufacturing plural devices (such as optical devices) over the free-standing substrate 30, it is possible to suppress variations in quality among the plural devices. In addition, it is possible to improve the yield. In particular, a more preferable effect is realized by manufacturing devices (such as optical devices) over the second main surface (semipolar plane on the Ga polarity side) of the free-standing substrate 30.

As described above, the bulk crystal manufactured by the above characteristic manufacturing method has a large maximum diameter of 50 mm or more and 4 inches or less. The free-standing substrate 30 obtained by being cut out from such a large-diameter bulk crystal also has a large maximum diameter of 50 mm or more and 4 inches or less.

Examples

<First Evaluation>

In the first evaluation, it is confirmed that the plane orientation of the growth plane of the group III nitride semiconductor layer can be set to the plane on the N polarity side by making all of the "plural factors for setting the plane orientation of the growth plane of the group III nitride semiconductor layer to the plane on the N polarity side" described above be satisfied. In the first evaluation, it is confirmed that the plane orientation of the growth plane of the group III nitride semiconductor layer is set to the plane on the Ga polarity side in a case where at least one of the "plural factors for setting the plane orientation of the growth plane of the group III nitride semiconductor layer to the plane on the N polarity side" is not satisfied.

First, a sapphire substrate was prepared in which the plane orientation of the main surface was a plane inclined by 2° from the m-plane ((10-10) plane) in a direction in which the m-plane becomes parallel to the a-plane. The thickness of the sapphire substrate was 430 µm, and the diameter was 2 inches.

Then, the heat treatment step S20 was performed on the prepared sapphire substrate under the following conditions.
Temperature: 1000 to 1050° C.
Pressure: 100 torr
Carrier gas: $H_2$, $N_2$
Heat treatment time: 10 minutes or 15 minutes
Carrier gas supply rate: 15 slm
In the heat treatment step S20, $NH_3$ of 20 slm was supplied to perform nitriding treatment.

Thereafter, the pre-flow step S30 was performed under the following conditions.
Temperature: 800 to 930° C.
Pressure: 100 torr
Trimethylaluminum supply rate, supply time: 90 sccm, 10 seconds
Carrier gas: $H_2$, $N_2$
Carrier gas supply rate: 15 slm
Thereafter, the buffer layer forming step S40 was performed under the following conditions to form an AlN layer.
Growth method: MOCVD method
Growth temperature: 800 to 930° C.
Pressure: 100 torr
Trimethylaluminum supply rate: 90 sccm
$NH_3$ supply rate: 5 slm
Carrier gas: $H_2$, $N_2$
Carrier gas supply rate: 15 slm
Thereafter, the first growth step S50 was performed under the following conditions to form a group III nitride semiconductor layer.
Growth method: MOCVD method
Pressure: 100 torr
TMGa supply rate: 50 to 500 sccm (continuous change)
$NH_3$ supply rate: 5 to 10 slm (continuous change)
Carrier gas: $H_2$, $N_2$
Carrier gas supply rate: 15 slm
Growth rate: 10 µm/h or higher
The growth temperature of a first sample was controlled to be 900° C.±25° C., and the growth temperature of a second sample was controlled to be 1050° C.±25° C. That is, the first sample is a sample satisfying all of the "plural factors for setting the plane orientation of the growth plane of the group III nitride semiconductor layer to the plane on the N polarity side" described above. The second sample is a sample that does not satisfy some (growth temperature in the first growth step S50) of the "plural factors for setting the plane orientation of the growth plane of the group III nitride semiconductor layer to the plane on the N polarity side" described above.

The plane orientation of the growth plane of the group III nitride semiconductor layer of the first sample was a plane inclined from the (−1-12-4) plane by 5.0° in the −a-plane direction and inclined by 8.5° or less in a direction in which the plane becomes parallel to the m-plane. On the other hand, the plane orientation of the growth plane of the group III nitride semiconductor layer of the second sample was a plane inclined from the (11-24) plane by 5.0° in the a-plane direction and 8.5° or less in a direction in which the plane becomes parallel to the m-plane. That is, it can be seen that it is possible to adjust whether the plane orientation of the growth plane is Ga polarity or N polarity depending on whether or not the "plural factors for setting the plane orientation of the growth plane of the group III nitride semiconductor layer to the plane on the N polarity side" described above are satisfied.

Figure 7:
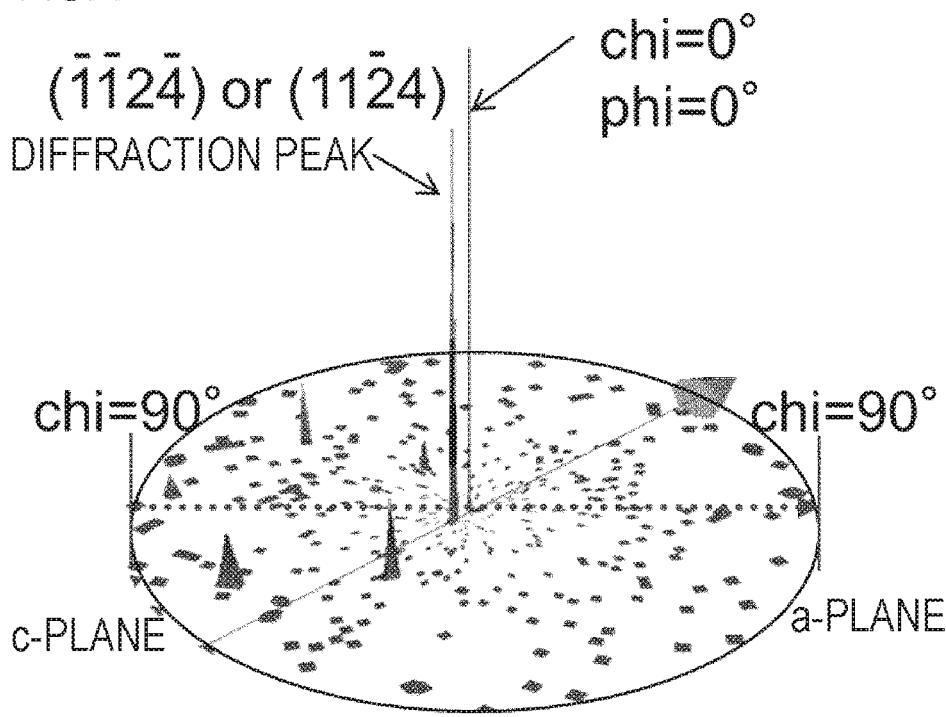
FIG. 7 is a diagram showing the characteristics of the free-standing substrate 10 and the template substrate 20 of the present embodiment.

FIG. 7 shows XRD pole point measurement results of the (−1-12-4) plane or the (11-24) plane in the first sample. It is possible to confirm that the diffraction peak is a position shifted by several degrees from the center point of the pole point. In a case where the shift of the angle is measured in detail, it is possible to confirm that the peak is a position of 5.0° in the −a-plane direction and 8.5° in a direction in which the plane becomes parallel to the m-plane or a position of 5.0° in the a-plane direction and 8.5° in a direction in which the plane becomes parallel to the m-plane.

In addition, the present inventors have confirmed that, in a case where some of the other "plural factors for setting the plane orientation of the growth plane of the group III nitride semiconductor layer to the plane on the N polarity side" described above are not satisfied or in a case where nothing is satisfied, the plane orientation of the growth plane is Ga polarity.

<Second Evaluation>

In the second evaluation, it is confirmed that the plane orientation of the growth plane of the group III nitride semiconductor layer can be adjusted by adjusting the "plural factors for adjusting the plane orientation of the growth plane of the group III nitride semiconductor layer" described above.

First, plural sapphire substrates having various main surface orientations were prepared. The thickness of the sapphire substrate was 430 µm, and the diameter was 2 inches.

Then, the heat treatment step S20 was performed on each of the prepared sapphire substrates under the following conditions.
Temperature: 1000 to 1050° C.

Pressure: 200 torr
Growth time: 10 minutes
Carrier gas: $H_2$, $N_2$
Carrier gas supply rate: 15 slm In addition, samples were prepared by changing the presence or absence of nitriding treatment at the time of heat treatment. Specifically, both a sample for which $NH_3$ of 20 slm was supplied at the time of heat treatment and which was subjected to nitride treatment and a sample for which $NH_3$ was not supplied and which was not subjected to nitride treatment were prepared.

Thereafter, the pre-flow step S30 was performed under the following conditions.
Temperature: 880 to 930° C.
Pressure: 100 torr
Trimethylaluminum supply rate, supply time: 90 sccm, 10 seconds
Carrier gas: $H_2$, $N_2$
Carrier gas supply rate: 15 slm In addition, both a sample on which the pre-flow step S30 was performed and a sample on which the pre-flow step S30 was not performed were prepared.

Thereafter, a buffer layer (AlN buffer layer) having a thickness of about 150 nm was formed over the main surface (exposed surface) of the sapphire substrate under the following conditions.

Growth method: MOCVD method
Pressure: 100 torr
V/III ratio: 5184
TMAl supply rate: 90 ccm
$NH_3$ supply rate: 5 slm
Carrier gas: $H_2$, $N_2$
Carrier gas supply rate: 15 slm The growth temperature was changed in the range of 700° C. or higher and 1110° C. or lower for each sample.

Thereafter, a group III nitride semiconductor layer (GaN layer) having a thickness of about 15 μm was formed over the buffer layer under the following conditions.

Growth method: MOCVD method
Growth temperature: 900 to 1100° C.
Pressure: 100 torr
V/III ratio: 321
TMGa supply rate: 50 to 500 ccm (ramp up)
$NH_3$ supply rate: 5 to 10 slm (ramp up)
Carrier gas: $H_2$, $N_2$
Carrier gas supply rate: 15 slm As described above, a group III nitride semiconductor substrate 10 was manufactured in which the sapphire substrate, the buffer layer, and the group III nitride semiconductor layer were laminated in this order.

Tables 1 to 7 show the relationship between the "plural factors for adjusting the plane orientation of the growth plane of the group III nitride semiconductor layer" and the plane orientation of the growth plane of the group III nitride semiconductor layer.

TABLE 1

| | | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|---|
| First evaluation | First sample | Plane inclined from m-plane (10-10) by 2° in direction in which the plane becomes parallel to a-plane | With nitriding treatment | With pre-flow | 925 ± 25 | 950 ± 25 | Inclined from (-1-12-4) plane by 5.0° in -a-plane direction and inclined by 8.5° in direction in which the plane becomes parallel to m-plane |
| | Second sample | | | | | 1050 ± 25 | Inclined from (11-24) plane by 5.0° in a-plane direction and inclined by 8.5° in direction in which the plane becomes parallel to m-plane |

TABLE 2

| | | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|---|
| Second evaluation | | m-plane (10-10) or plane inclined by 0.5° in any direction | With nitriding treatment | With pre-flow | 925 ± 25 | 950 ± 25 | Inclined from (-1-12-4) plane by 4.0° in -a-plane direction and inclined by 7.5° in direction in which the plane becomes parallel to m-plane |
| | | | With nitriding | With pre-flow | 925 ± 25 | 1075 ± 25 | Inclined from (11-24) plane by 4.0° in a-plane direction and inclined by 7.5° in |

TABLE 2-continued

| Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|
| from m-plane (10-10) | treatment | | | | direction in which the plane becomes parallel to m-plane |
| | With nitriding treatment | With pre-flow | 1085 ± 25 | 950 ± 25 | Inclined by 0.5° in any direction from (11-22) plane |
| | With nitriding treatment | With pre-flow | 725 ± 25 | 950 ± 25 | Inclined by 0.5° in any direction from (11-22) plane |
| | With nitriding treatment | With pre-flow | 1085 ± 25 | 1075 ± 2.5 | Inclined by 0.5° in any direction from (11-22) plane |
| | With nitriding treatment | No pre-flow | 1085 ± 25 | 1075 ± 25 | Inclined by 0.5° in any direction from (11-22) plane |
| | With nitriding treatment | No pre-flow | 925 ± 25 | 950 ± 25 | Inclined from (11-24) plane by 4.0° in a-plane direction and inclined by 7.5° in direction in which the plane becomes parallel to m-plane |
| | No nitriding treatment | With pre-flow | 925 ± 25 | 950 ± 25 | Inclined by 0.5° in any direction from (10-10) plane |

TABLE 3

| | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 0.5° or more and 1.5° or less from m-plane (10-10) in direction in which the plane becomes parallel to a-plane | With nitriding treatment | With pre-flow | 950 ± 25 | 975 ± 25 | Inclined from (-1-12-4) plane by 4.4° in -a-plane direction and inclined by 7.9° in direction in which the plane becomes parallel to m-plane |
| | | With nitriding treatment | With pre-flow | 950 ± 25 | 1070 ± 25 | Inclined from (11-24) plane by 4.4° in a-plane direction and inclined by 7.9° in direction in which the plane becomes parallel to m-plane |
| | | With nitriding treatment | With pre-flow | 1075 ± 25 | 975 ± 25 | Inclined by 1.0° in any direction from (11-22) plane to m-plane |
| | | With nitriding treatment | With pre-flow | 750 ± 25 | 975 ± 25 | Inclined by 1.0° in any direction from (11-22) plane to m-plane |
| | | With nitriding treatment | With pre-flow | 1075 ± 25 | 1070 ± 2.5 | Inclined by 1.0° in any direction from (11-22) plane to m-plane |
| | | With nitriding treatment | No pre-flow | 1075 ± 25 | 1070 ± 25 | Inclined by 1.0° in any direction from (11-22) plane to m-plane |
| | | With nitriding treatment | No pre-flow | 950 ± 25 | 975 ± 25 | Inclined from (11-24) plane by 4.4° in a-plane direction and inclined by 7.9° in direction in which the plane becomes parallel to m-plane |
| | | No nitriding treatment | With pre-flow | 950 ± 25 | 975 ± 25 | (20-27) plane |

TABLE 4

| | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 1.5° or more and 2.5° or less from m-plane (10-10) in direction in which the plane becomes parallel to a-plane | With nitriding treatment | With pre-flow | 925 ± 25 | 950 ± 25 | Inclined from (-1-12-4) plane by 5.0° in -a-plane direction and inclined by 8.5° in direction in which the plane becomes parallel to m-plane |
| | | With nitriding treatment | With pre-flow | 925 ± 25 | 1070 ± 25 | Inclined from (11-24) plane by 5.0° in a-plane direction and inclined by 8.5° in direction in which the plane becomes parallel to m-plane |
| | | With nitriding treatment | With pre-flow | 1080 ± 25 | 950 ± 25 | Inclined by 2.0° in any direction from (11-22) plane to m-plane |
| | | With nitriding treatment | With pre-flow | 750 ± 25 | 950 ± 25 | Inclined by 2.0° in any direction from (11-22) plane to m-plane |
| | | With nitriding treatment | With pre-flow | 1080 ± 25 | 1070 ± 2.5 | Inclined by 2.0° in any direction from (11-22) plane to m-plane |
| | | With nitriding treatment | No pre-flow | 1080 ± 25 | 1070 ± 25 | Inclined by 2.0° in any direction from (11-22) plane to m-plane |
| | | With nitriding treatment | No pre-flow | 925 ± 25 | 950 ± 25 | Inclined from (11-24) plane by 5.0° in a-plane direction and inclined by 8.5° in direction in which the plane becomes parallel to m-plane |
| | | No nitriding treatment | With pre-flow | 925 ± 25 | 950 ± 25 | (20-27) plane |

TABLE 5

| | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 4.5° or more and 5.5° or less from m-plane (10-10) in direction in which the plane becomes parallel to a-plane | With nitriding treatment | With pre-flow | 950 ± 25 | 975 ± 25 | Inclined from (-1-12-4) plane by 6.9° in -a-plane direction and inclined by 11.6° in direction in which the plane becomes parallel to m-plane |
| | | With nitriding treatment | With pre-flow | 925 ± 25 | 1075 ± 25 | Inclined from (11-24) plane by 6.9° in a-plane direction and inclined by 11.6° in direction in which the plane becomes parallel to m-plane |
| | | With nitriding treatment | With pre-flow | 1075 ± 25 | 975 ± 25 | Inclined by 5.0° in any direction from (11-22) plane to m-plane |
| | | With nitriding treatment | With pre-flow | 750 ± 25 | 975 ± 25 | Inclined by 5.0° in any direction from (11-22) plane to m-plane |
| | | With nitriding treatment | With pre-flow | 1075 ± 25 | 1075 ± 2.5 | Inclined by 5.0° in any direction from (11-22) plane to m-plane |
| | | With nitriding treatment | No pre-flow | 1075 ± 25 | 1075 ± 25 | Inclined by 5.0° in any direction from (11-22) plane to m-plane |
| | | With nitriding treatment | No pre-flow | 950 ± 25 | 975 ± 25 | Inclined from (11-24) plane by 6.9° in a-plane direction and inclined by 11.6° in direction in which the plane becomes parallel to m-plane |
| | | No nitriding treatment | With pre-flow | 950 ± 25 | 975 ± 25 | Inclined by 5.0° in any direction from (11-22) plane to m-plane |

TABLE 6

| | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 6.5° or more and 7.5° or less from m-plane (10-10) in direction in which the plane becomes parallel to a-plane | With nitriding treatment | With pre-flow | 925 ± 25 | 950 ± 25 | Inclined from (-1-12-4) plane by 8.4° in -a-plane direction and inclined by 12.2° in direction in which the plane becomes parallel to m-plane |
| | | With nitriding treatment | With pre-flow | 925 ± 25 | 1070 ± 25 | Inclined from (11-24) plane by 8.4° in a-plane direction and inclined by 12.2° in direction in which the plane becomes parallel to m-plane |
| | | With nitriding treatment | With pre-flow | 1080 ± 25 | 950 ± 25 | Inclined by 7.0° in any direction from (11-22) plane to m-plane |
| | | With nitriding treatment | With pre-flow | 750 ± 25 | 950 ± 25 | Inclined by 7.0° in any direction from (11-22) plane to m-plane |
| | | With nitriding treatment | With pre-flow | 1080 ± 25 | 1070 ± 2.5 | Inclined by 7.0° in any direction from (11-22) plane to m-plane |
| | | With nitriding treatment | No pre-flow | 1080 ± 25 | 1070 ± 25 | Inclined by 7.0° in any direction from (11-22) plane to m-plane |
| | | With nitriding treatment | No pre-flow | 925 ± 25 | 950 ± 25 | Inclined from (11-24) plane by 8.4° in a-plane direction and inclined by 12.2° in direction in which the plane becomes parallel to m-plane |
| | | No nitriding treatment | With pre-flow | 925 ± 25 | 950 ± 25 | (10-13) plane |

TABLE 7

| | Sapphire main surface | Presence or absence of nitriding treatment at time of temperature rising | Presence or absence of trimethyl-aluminum pre-flow step | AlN buffer growth temperature (° C.) | GaN growth temperature (° C.) | Growth plane of group III nitride semiconductor layer |
|---|---|---|---|---|---|---|
| Second evaluation | Plane inclined by 9.5° or more and 10.5° or less from m-plane (10-10) in direction in which the plane becomes parallel to a-plane | With nitriding treatment | With pre-flow | 925 ± 25 | 975 ± 25 | Inclined from (-1-12-4) plane by 10.4° in -a-plane direction and inclined by 14.8° in direction in which the plane becomes parallel to m-plane |
| | | With nitriding treatment | With pre-flow | 925 ± 25 | 1070 ± 25 | Inclined from (11-24) plane by 10.4° in a-plane direction and inclined by 14.8° in direction in which the plane becomes parallel to m-plane |
| | | With nitriding treatment | With pre-flow | 1080 ± 25 | 975 ± 25 | Inclined by 10.0° in any direction from (11-22) plane to m-plane |
| | | With nitriding treatment | With pre-flow | 750 ± 25 | 975 ± 25 | Inclined by 10.0° in any direction from (11-22) plane to m-plane |
| | | With nitriding treatment | With pre-flow | 1080 ± 25 | 1070 ± 2.5 | Inclined by 10.0° in any direction from (11-22) plane to m-plane |
| | | With nitriding treatment | No pre-flow | 1080 ± 25 | 1070 ± 25 | Inclined by 10.0° in any direction from (11-22) plane to m-plane |
| | | With nitriding treatment | No pre-flow | 925 ± 25 | 975 ± 25 | Inclined from (11-24) plane by 10.4° in a-plane direction and inclined by 14.8° in direction in which the plane becomes parallel to m-plane |
| | | No nitriding treatment | With pre-flow | 925 ± 25 | 975 ± 25 | (10-15) plane |

The column of "Sapphire main surface" in the Tables shows the plane orientation of the main surface of the sapphire substrate. The column of "Nitriding treatment at the time of temperature rising" shows the presence or absence ("present" or "absent") of nitriding treatment at the time of temperature rising during the heat treatment step S20. The column "Presence or absence of trimethylaluminum pre-flow step" shows the presence or absence ("present" or "absent") of the trimethylaluminum pre-flow step. The column of "AlN buffer growth temperature" shows the growth temperature in the buffer layer forming step. The column of "GaN growth temperature" shows the growth temperature in the GaN layer forming step. The column of "Growth plane of group III-nitride semiconductor layer" shows the plane orientation of the growth plane of the group III-nitride semiconductor layer.

According to the results, it can be seen that the plane orientation of the growth plane of the group III nitride semiconductor layer can be adjusted to semipolar and Ga polarity by adjusting the "plural factors for adjusting the plane orientation of the growth plane of the group III nitride semiconductor layer" described above. Then, according to the result of the first evaluation and the result of the second evaluation, in a case where all of the "plural factors for setting the plane orientation of the growth plane of the group III nitride semiconductor layer to the N polarity side" are satisfied, the plane orientation of the growth plane of the group III nitride semiconductor layer can be adjusted to semipolar and N polarity by adjusting the "plural factors for adjusting the plane orientation of the growth plane of the group III nitride semiconductor layer".

<Third Evaluation>

In the third evaluation, the optical characteristics of the free-standing substrate 30 is evaluated by PL measurement.

Example

First, a GaN layer (first growth layer 23) was formed over a φ4-inch m-plane sapphire substrate having an off angle of 2° in the a-plane direction with a buffer layer interposed therebetween using the MOCVD method. The main surface (exposed surface) of the first growth layer 23 was a semipolar plane on the N polarity side. Specifically, the main surface (exposed surface) of the first growth layer 23 was a surface having an off angle of about 5° from the (−1−12−4) plane in the c-plane direction and about 8° in the m-plane direction.

Thereafter, a GaN crystal was grown over the first growth layer 23 using the HVPE method to form a GaN layer (second growth layer 25). Thereafter, a crystal of about φ54 mm was cut out by slicing a portion having a growth thickness of 3 mm or more in the bulk crystal formed of the first growth layer 23 and the second growth layer 25 in a direction perpendicular to the growth direction, and then shaped and polished. As a result, a free-standing substrate having an approximately (−1−12−4) plane of φ50 mm as a main surface was obtained.

Comparative Examples

From the bulk crystal of GaN grown on the c-plane, small pieces of 10 mm square having an approximately (11−24) plane as a main surface were cut out. Then, the nine small pieces were placed in 3 rows×3 columns on a support base. All of the small pieces were placed so that the approximately (11−24) plane was exposed. Thereafter, GaN crystal was grown over the small pieces using the HVPE method to form a GaN layer.

As a result, a GaN crystal having an approximately (11−24) plane of about 30 mm×30 mm×5 mm was obtained. The GaN crystal was sliced into plural pieces in a direction perpendicular to the growth direction and shaped and polished to obtain an free-standing substrate having an approximately (11−24) plane of about 25 mm² square as a main surface.

At this time, a free-standing substrate cut out from a portion close to the nine small pieces is set as Comparative Example 1, and a substrate cut out from a portion close to the final growth plane (a portion far from the nine small pieces) is set as Comparative Example 2. In Comparative Example 1, chipping occurred in a part of the free-standing substrate. In addition, cracking occurred in a part of Comparative Example 2.

Thus, in the example, a thick film was grown using the HVPE method with a semipolar plane on the N polarity side as a growth plane, and in the comparative examples, a thick film was grown using the HVPE method with a semipolar plane on the Ga polarity side as a growth plane.

[PL Measurement]

Under the following measurement conditions, PL measurement was performed on two main surfaces (approximately (−1−12−4) plane and approximately (11−24) plane), which were top and bottom surfaces of the free-standing substrate obtained in the example, and the (11−24) planes of Comparative Example 1 and Comparative Example 2.

Emitted laser: He—Cd laser (wavelength of 325 nm, rated output of 35 mW)

Mapping apparatus: YWaferMapper GS4 manufactured by Y. Systems. Co., Ltd.

Measurement temperature: room temperature

Mapping unit (measurement unit): 1 mm² square

Measurement wavelength range: 340 to 700 nm

Measurement target region (Example): inside of a circle of φ46 mm located approximately at the center of the free-standing substrate Measurement target region (Comparative Examples 1 and 2): Region of 25 mm located approximately at the center of the free-standing substrate In the statistical processing in the measurement results of Comparative Example 1 and Comparative Example 2, error values due to mapping outside a sample region are excluded. Therefore, statistical results described below do not include the effect of error values, and are all the measurement results of the samples of the comparative examples.

Figure 8:
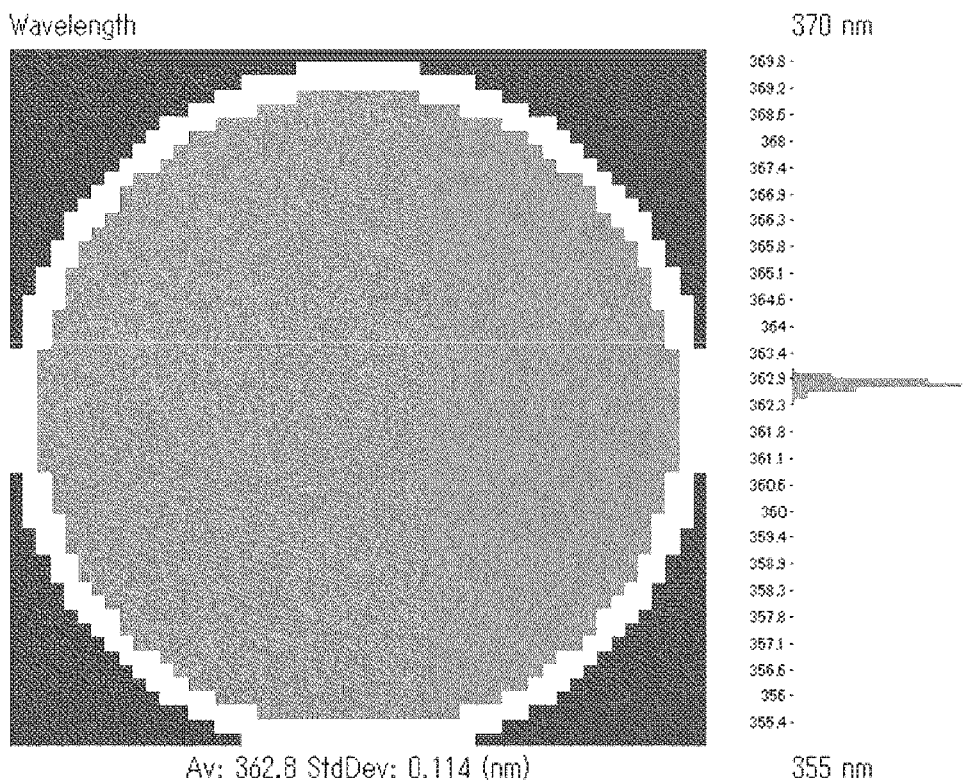
FIG. 8 is a diagram showing the characteristics of the free-standing substrate 30 of the present embodiment.
Figure 9:
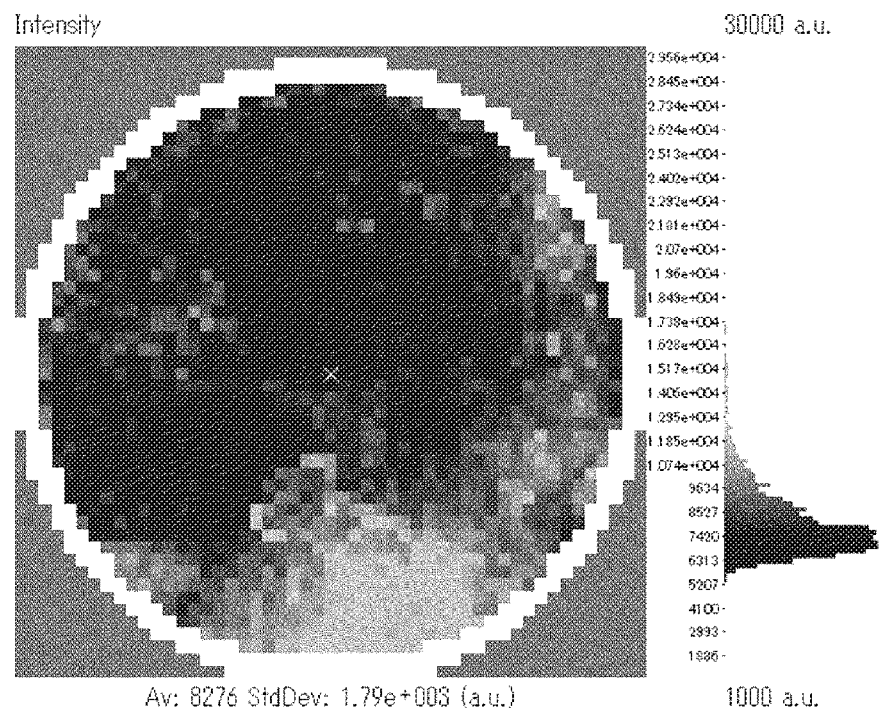
FIG. 9 is a diagram showing the characteristics of the free-standing substrate 30 of the present embodiment.
Figure 10:
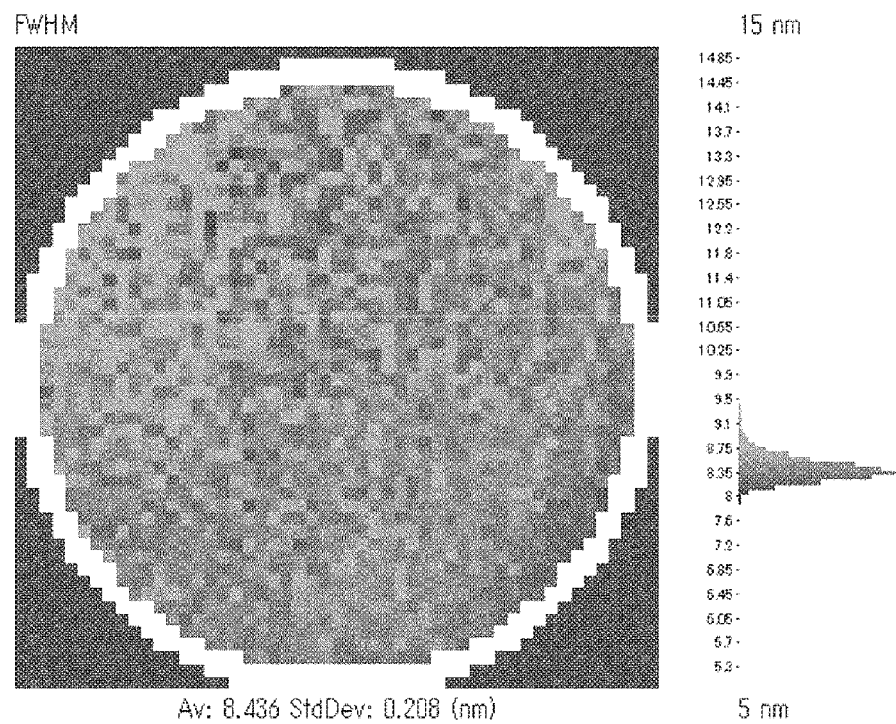
FIG. 10 is a diagram showing the characteristics of the free-standing substrate 30 of the present embodiment.
Figure 11:
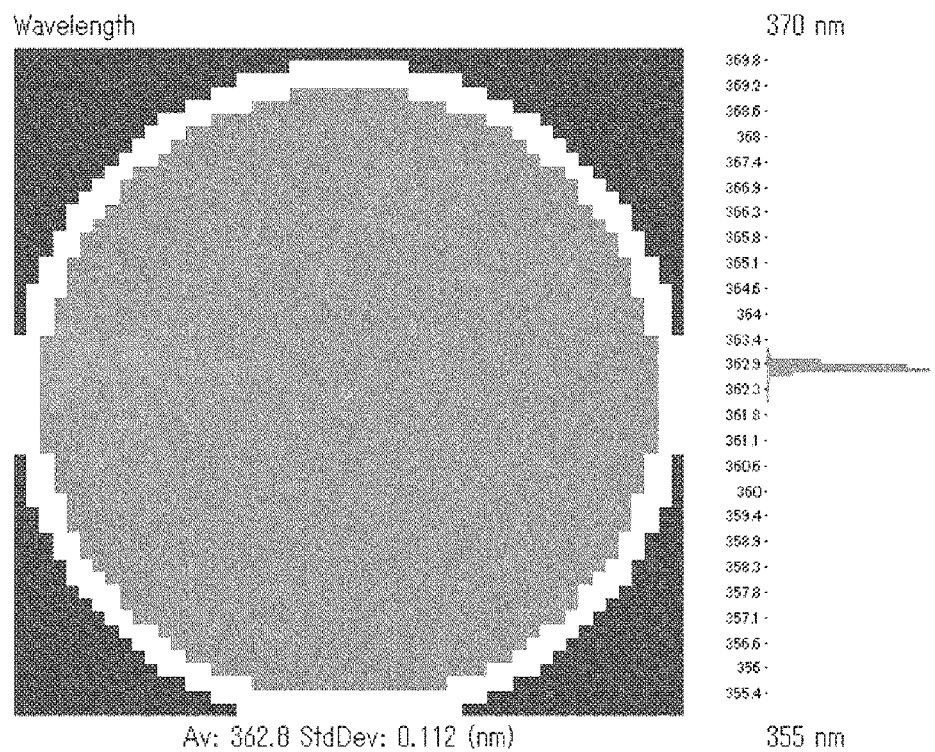
FIG. 11 is a diagram showing the characteristics of the free-standing substrate 30 of the present embodiment.
Figure 12:
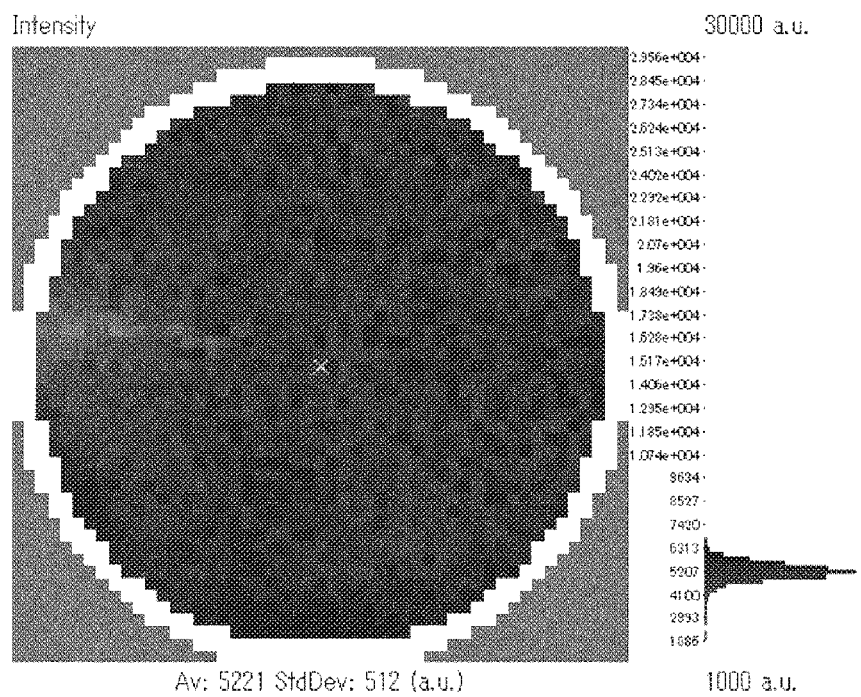
FIG. 12 is a diagram showing the characteristics of the free-standing substrate 30 of the present embodiment.
Figure 13:
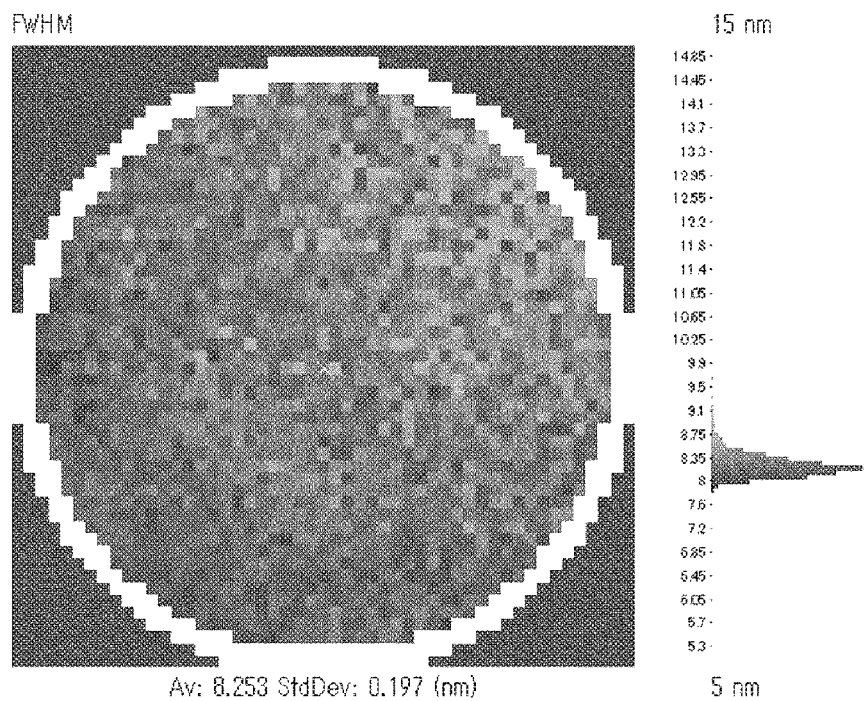
FIG. 13 is a diagram showing the characteristics of the free-standing substrate 30 of the present embodiment.
Figure 14:
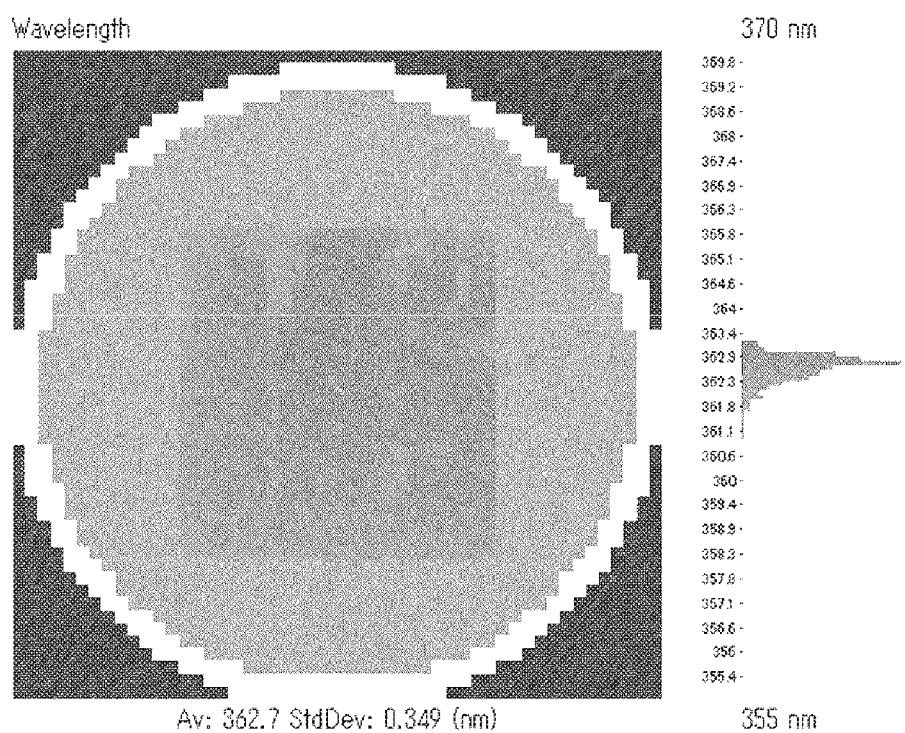
FIG. 14 is a diagram showing the characteristics of a substrate of a comparative example.
Figure 15:
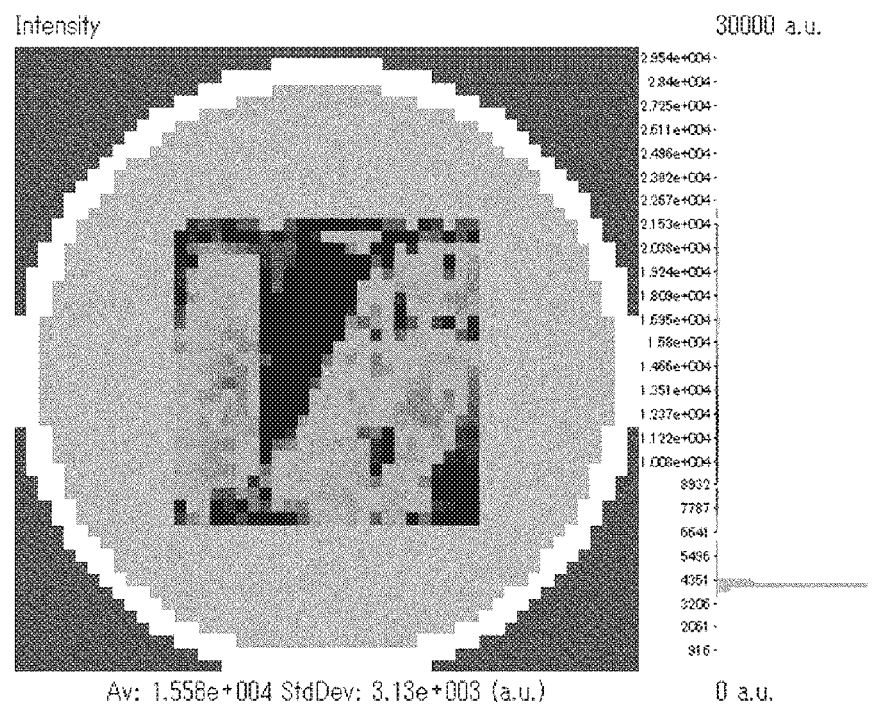
FIG. 15 is a diagram showing the characteristics of a substrate of a comparative example.
Figure 16:
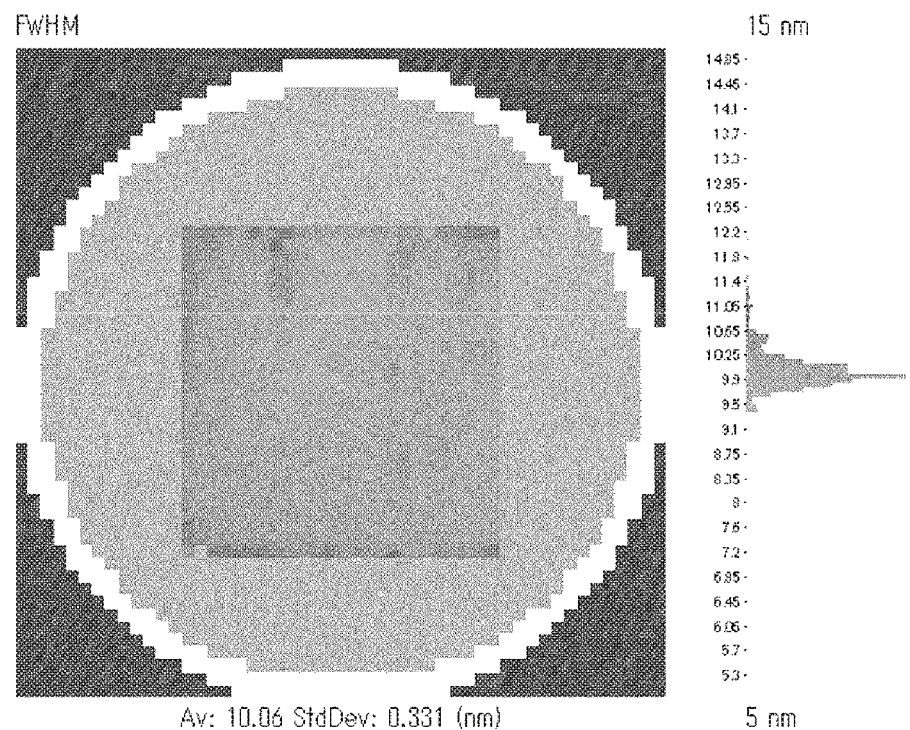
FIG. 16 is a diagram showing the characteristics of a substrate of a comparative example.
Figure 17:
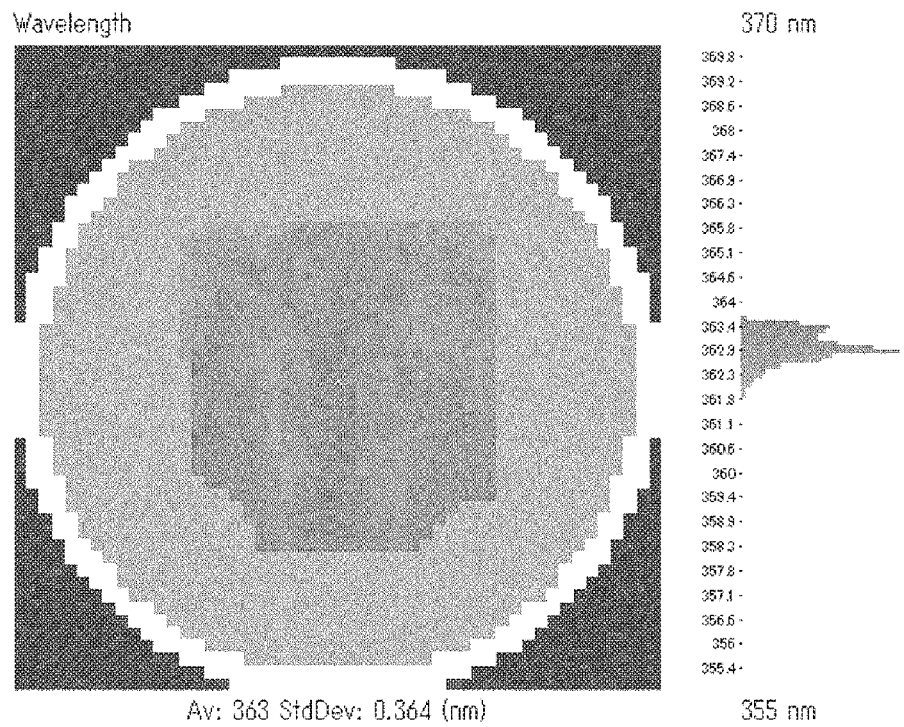
FIG. 17 is a diagram showing the characteristics of a substrate of a comparative example.
Figure 18:
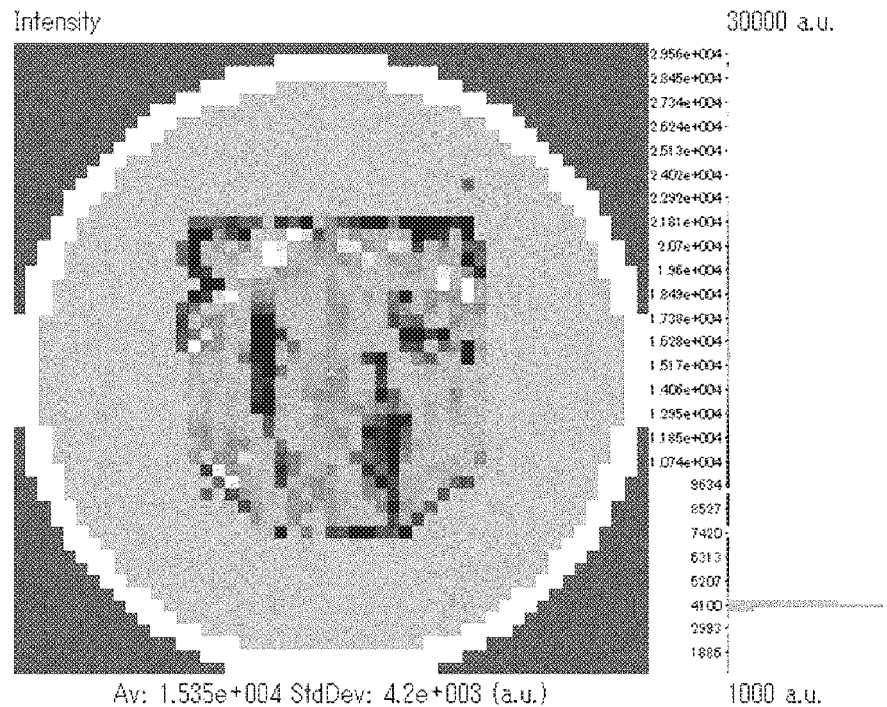
FIG. 18 is a diagram showing the characteristics of a substrate of a comparative example.
Figure 19:
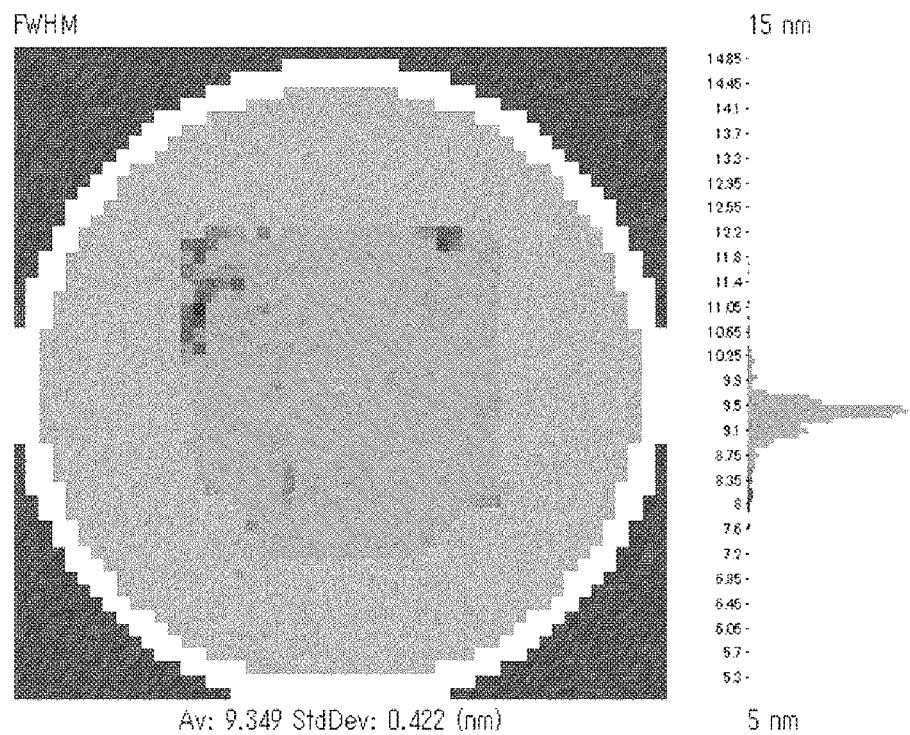
FIG. 19 is a diagram showing the characteristics of a substrate of a comparative example.

FIGS. 8 to 10 show the results of PL measurement on the approximately (−1−12−4) plane of the example. FIGS. 11 to 13 show the results of PL measurement on the approximately (11−24) plane of the example. FIGS. 14 to 16 show the results of PL measurement on the approximately (11−24) plane of Comparative Example 1. FIGS. 17 to 19 show the results of PL measurement on the approximately (11−24) plane of Comparative Example 2. As described above, the measurement target region is different between the example and the comparative examples. This is also apparent from the mapping data of these diagrams.

FIGS. 8, 11, 14, and 17 show an image in which the emission wavelength of each of plural measurement units is mapped and a histogram of the emission wavelength. In the diagrams, "Av" is an average value of the emission wavelength, and "StdDev" is a standard deviation of the emission wavelength. From these results, it can be seen that, in the approximately (−1−12−4) plane and the approximately (11−

24) plane of the example, variations in the in-plane emission wavelength are smaller than those in Comparative Example 1 and Comparative Example 2.

FIGS. 9, 12, 15, and 18 show an image in which the emission intensity of each of plural measurement units is mapped and a histogram of the emission intensity. In the diagrams, "Av" is an average value of the emission intensity, and "StdDev" is a standard deviation of the emission intensity. The lower peak in the histograms of FIGS. 15 and 18 is obtained by counting the color of a region other than the measurement target region. From these results, it can be seen that, in the approximately (11−24) plane, variations in the in-plane emission intensity are smaller than those in Comparative Example 1 and Comparative Example 2.

FIGS. 10, 13, 16, and 19 show an image in which the half width of the PL spectrum (spectrum of the emission intensity for each wavelength) of each of plural measurement units is mapped and a histogram of the half width. In the diagrams, "Av" is an average value of the half width, and "StdDev" is a standard deviation of the half width. From these results, it can be seen that, in the approximately (−1−12−4) plane and the approximately (11−24) plane of the example, variations in the in-plane half width are smaller than those in Comparative Example 1 and Comparative Example 2.

Here, Table 8 shows the measurement results of the approximately (−1−12−4) plane, the approximately (11−24) plane, and Comparative Example 1, and Comparative Example 2. In the table, the average value of the emission wavelength, the variation coefficient of the emission wavelength, the average value of the emission intensity, the variation coefficient of the emission intensity, the average value of the half width, and the variation coefficient of the half width are shown.

From the above, it could be confirmed that, in the approximately (−1−12−4) plane and the approximately (11−24) plane of the example, variations in the in-plane optical characteristics were smaller than those in Comparative Example 1 and Comparative Example 2. In the measurement results of Comparative Example 1 and Comparative Example 2, streaky unique results are observed, but these correspond to an upper portion of the boundary between the small pieces placed before the crystal growth. That is, this is due to the influence of the small piece junction growth. It is also one of the features that the example does not have such a singular point.

<Fourth Evaluation>

Next, it is confirmed that the free-standing substrate 30 having a semipolar plane as a main surface and a large maximum diameter of 50 mm or more and 4 inches or less can be obtained by the manufacturing method of the present embodiment.

First, the template substrate 20 was prepared in which a GaN layer (first growth layer 23) was formed over the sapphire substrate 21, which had a diameter of φ4 inches and in which the plane orientation of the main surface was an m-plane, with the buffer layer 22 interposed therebetween using the MOCVD. The plane orientation of the main surface of the first growth layer 23 was a plane having an off angle of about 5° from the (−1−12−4) plane in the c-plane direction and about 8° in the m-plane direction, and the diameter was φ4 inches.

Then, the template substrate 20 was fixed to a carbon susceptor. Specifically, the bottom surface of the sapphire substrate 21 was bonded to the main surface of the carbon susceptor using an alumina based adhesive.

TABLE 8

| Items | Example: (−1−12−4) plane | Example: (11−24) plane | Comparative Example (1) | Comparative Example (2) |
|---|---|---|---|---|
| Emission wavelength average value [nm] | 362.8 | 362.8 | 362.7 | 363.0 |
| Emission wavelength variation coefficient [%] | 0.031 | 0.031 | 0.096 | 0.100 |
| Emission intensity average value [a.u.] | 8276 | 5221 | 15580 | 15350 |
| Emission intensity variation coefficient [%] | 21.63 | 9.807 | 20.09 | 27.36 |
| Half width average value [nm] | 8.436 | 8.253 | 10.06 | 9.349 |
| Half width variation coefficient [%] | 2.466 | 2.387 | 3.290 | 4.514 |

From the table, it can be seen that the variation coefficient of the emission wavelength is 0.05% or less in both the approximately (−1−12−4) plane and the approximately (11−24) plane of the example. In addition, in both of Comparative Example 1 and Comparative Example 2, the variation coefficient of the emission wavelength is greater than 0.05%.

In addition, from the table, it can be seen that, in the approximately (11−24) plane of the example, the variation coefficient of the emission intensity is 15% or less, preferably 10% or less. In addition, in both of Comparative Example 1 and Comparative Example 2, the variation coefficient of the emission intensity is greater than 15%.

In addition, from the table, it can be seen that the variation coefficient of the half width is 3.0% or less in both the approximately (−1−12−4) plane and the approximately (11−24) plane of the example. In addition, in both of Comparative Example 1 and Comparative Example 2, the variation coefficient of the half width is greater than 3.0%.

Then, in a state in which the template substrate 20 was fixed to the carbon susceptor, group III nitride semiconductor (GaN) was grown over the main surface of the first growth layer 23 using the HVPE method. As a result, a GaN layer (a part of the second growth layer 25) formed of single crystal group III nitride semiconductor was formed. The growth conditions are as follows.

Growth temperature: 1040° C.
Growth time: 15 hours
V/III ratio: 10
Growth film thickness: 4.4 mm Then, a laminate including the carbon susceptor, the template substrate 20, and the part of the second growth layer 25 was taken out from the HVPE apparatus and cooled to the room temperature. The laminate after cooling was observed, and cracks were present on the surface. In addition, polycrystalline group III nitride semiconductors were attached along the outer periphery of the laminate, these were connected to each other to form an annular shape, and the laminate was held thereinside.

Then, in a state in which the polycrystalline group III nitride semiconductor remained, group III nitride semiconductor (GaN) was grown over the main surface of the GaN layer (a part of the second growth layer 25) with a crack using the HVPE method. As a result, a GaN layer (another part of the second growth layer 25) formed of single crystal group III nitride semiconductor was formed. The growth conditions are as follows.

Growth temperature: 1040° C.
Growth time: 14 hours
V/III ratio: 10
Growth film thickness: 3.0 mm (total film thickness of the second growth layer 25 is 7.4 mm)

The maximum diameter of the second growth layer 25 was about φ4 inches. In addition, the maximum diameter of a surface including the second growth layer 25 and the polycrystalline group III nitride semiconductor along the outer periphery thereof was about 130 mm. In addition, cracking did not occur in the second growth layer 25.

Then, the second growth layer 25 was sliced to obtain plural free-standing substrates 30. Cracking did not occur in the free-standing substrate 30, and the maximum diameter was about φ4 inches.

Hereinafter, examples of reference forms are additionally described.

1. A group III nitride semiconductor substrate that is formed of group III nitride semiconductor crystals, in which both exposed first and second main surfaces in a relationship of top and bottom are semipolar planes, and a variation coefficient of an emission wavelength of each of the first and second main surfaces is 0.05% or less in PL measurement performed under conditions in which mapping is performed in units of an area of 1 mm$^2$ by emitting helium-cadmium (He—Cd) laser, which has a wavelength of 325 nm and an output of 10 mW or more and 40 mW or less, at room temperature.

2. The group III nitride semiconductor substrate according to 1, in which a variation coefficient of an emission intensity of the second main surface in PL measurement performed under the conditions is 15% or less.

3. The group III nitride semiconductor substrate according to 2, in which the variation coefficient of the emission intensity of the second main surface is 10% or less.

4. The group III nitride semiconductor substrate according to 2, in which the second main surface is a semipolar plane on a Ga polarity side.

5. The group III nitride semiconductor substrate according to 1, in which a variation coefficient of a half width of a PL spectrum of each of the first and second main surfaces in PL measurement performed under the conditions is 3.0% or less.

6. The group III nitride semiconductor substrate according to any one of 1 to 5, in which a film thickness is 300 μm or more and 1000 μm or less.

This application claims priority based on Japanese Patent Application No. 2017-052384 filed on Mar. 17, 2017, the entire disclosure of which is incorporated herein.

The invention claimed is:

1. A group III nitride semiconductor substrate that is formed of group III nitride semiconductor crystals, wherein both exposed first and second main surfaces in a relationship of top and bottom are semipolar planes, and a variation coefficient of an emission wavelength of each of the first and second main surfaces is 0.05% or less in photoluminescence (PL) measurement performed under conditions in which mapping is performed in units of an area of 1 mm$^2$ by emitting helium-cadmium (He-Cd) laser, which has a wavelength of 325 nm and an output of 10 mW or more and 40 mW or less, at room temperature.

2. The group III nitride semiconductor substrate according to claim 1,
wherein a variation coefficient of an emission intensity of the second main surface in PL measurement performed under the conditions according to claim 1 is 15% or less.

3. The group III nitride semiconductor substrate according to claim 2,
wherein the variation coefficient of the emission intensity of the second main surface is 10% or less.

4. The group III nitride semiconductor substrate according to claim 2,
wherein the second main surface is a semipolar plane on a Ga polarity side.

5. The group III nitride semiconductor substrate according to claim 1,
wherein a variation coefficient of a half width of a PL spectrum of each of the first and second main surfaces in PL measurement performed under the conditions according to claim 1 is 3.0% or less.

6. The group III nitride semiconductor substrate according to claim 1,
wherein a film thickness is 300 μm or more and 1000 μm or less.

* * * * *